(12) United States Patent
Lee et al.

(10) Patent No.: US 8,203,895 B2
(45) Date of Patent: Jun. 19, 2012

(54) SEMICONDUCTOR MEMORY APPARATUS AND DRIVING METHOD USING THE SAME

(75) Inventors: Myoung Jin Lee, Ichon-si (KR); Ki Myung Kyung, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 232 days.

(21) Appl. No.: 12/650,446

(22) Filed: Dec. 30, 2009

(65) Prior Publication Data

US 2011/0075495 A1    Mar. 31, 2011

(30) Foreign Application Priority Data

Sep. 30, 2009  (KR) .................. 10-2009-0093609

(51) Int. Cl.
*G11C 7/00* (2006.01)
(52) U.S. Cl. .................. 365/191; 365/145; 365/226
(58) Field of Classification Search .................. 365/145, 365/149, 203, 205, 191, 189.09, 226
See application file for complete search history.

(56) References Cited

U.S. PATENT DOCUMENTS

| | | | | |
|---|---|---|---|---|
| 5,734,603 A | * | 3/1998 | Tai | 365/149 |
| 5,953,271 A | * | 9/1999 | Ooishi | 365/201 |
| 6,021,063 A | * | 2/2000 | Tai | 365/149 |
| 6,236,598 B1 | * | 5/2001 | Chou | 365/189.06 |
| 6,424,579 B1 | | 7/2002 | Akiyama et al. | |
| 6,859,380 B2 | * | 2/2005 | Ashikaga | 365/145 |
| 6,898,109 B2 | | 5/2005 | Hirose et al. | |
| 6,944,080 B2 | | 9/2005 | Sekiguchi et al. | |
| 7,274,613 B2 | | 9/2007 | Sekiguchi et al. | |
| 2002/0060942 A1 | | 5/2002 | Akiyama et al. | |
| 2003/0076704 A1 | * | 4/2003 | Ashikaga | 365/145 |
| 2006/0171186 A1 | * | 8/2006 | Yamaoka | 365/145 |
| 2007/0297257 A1 | | 12/2007 | Sekiguchi et al. | |

FOREIGN PATENT DOCUMENTS

| | | |
|---|---|---|
| JP | 2000-315393 | 11/2000 |
| JP | 2007-087571 | 4/2007 |
| JP | 2008-251102 | 10/2008 |

* cited by examiner

*Primary Examiner* — Gene Auduong
(74) *Attorney, Agent, or Firm* — William Park & Associates, Ltd.

(57) ABSTRACT

Various embodiments of a semiconductor memory apparatus and a related driving method are disclosed. According to one exemplary embodiment, a semiconductor memory apparatus may include a switching unit and a switching control unit. The switching unit couples or decouples a cell plate voltage line to or from a cell plate electrode in response to a control signal. The switching control unit is configured to enable the control signal at a first timing and disable the control signal at a second timing.

10 Claims, 3 Drawing Sheets

SEMICONDUCTOR MEMORY APPARATUS AND DRIVING METHOD USING THE SAME

CROSS-REFERENCE TO RELATED APPLICATION

The present application claims priority under 35 U.S.C 119(a) to Korean Application No. 10-2009-0093609, filed on Sep. 30, 2009, in the Korean Intellectual Property Office, which is incorporated herein by reference in its entirety as set forth in full.

BACKGROUND OF THE INVENTION

1. Technical Field

Various embodiments of the present disclosure generally relate to a semiconductor integrated circuit, and more particularly, to a semiconductor memory apparatus and a driving method using the same.

2. Related Art

In general, a semiconductor memory apparatus includes a plurality of memory cells to store data, each of which comprises a NMOS transistor and a capacitor.

FIG. 1 is a diagram showing a configuration of the memory cell of the conventional semiconductor memory apparatus. As shown in FIG. 1, the conventional memory cell includes a transistor N1 and a capacitor C1. The transistor N1 has a gate coupled to a wordline WL, a drain and a source coupled to a bitline BL and the capacitor respectively. One terminal of the capacitor C1 is coupled to the transistor N1 and the other terminal thereof is applied with a cell plate voltage VCP.

Where a data value of a logic high level is stored in the memory cell, the bitline BL receives a voltage from the capacitor C1 to increase a voltage level of the bitline BL when the wordline WL is enabled. On the contrary, where a data value of a logic low level is stored in the memory cell, the bitline BL applies a voltage to the capacitor C1 to decrease the voltage level of the bitline BL when the wordline WL is enabled.

A sense amplifier (not shown) detects the voltage level variation of the bitline BL to amplify the voltage level of the bitline BL. For example, the sense amplifier decreases the voltage level of the bitline BL to a ground voltage level when the voltage level of the bitline BL is decreased, and increases the voltage level of the bitline BL to a core voltage level when the voltage level of the bitline BL is increased. To allow the sense amplifier to operate normally as described above, it may require that a voltage level variation width of the bitline BL be equal to or greater than a predetermined voltage level width when the wordline is enabled.

In general, the semiconductor memory apparatus includes a large number of memory cells. Here if the memory cell having a data value different from that of an adjacent memory cell transfers data to the bitline (e.g., where the voltage level of the bitline is decreased, and a voltage level of an adjacent bitline is increased), the voltage level of the bitline cannot be decreased by as much as the predetermined voltage level width due to a coupling phenomenon. On the contrary, if the voltage level of the bitline is increased, and the voltage level of the adjacent bitline is decreased, the voltage level of the bitline cannot be increased by as much as the predetermined voltage level width due to the coupling phenomenon. Unless the voltage level variation width of the bitline is equal to or greater than the predetermined voltage level width, it may be difficult for the sense amplifier to perform the amplifying operation normally.

SUMMARY OF THE INVENTION

Accordingly, there is a need for an improved semiconductor memory apparatus and a related driving method that may overcome one or more of the problems discussed above. Therefore, various embodiments of the present invention may provide a semiconductor memory apparatus and an associated driving method that are capable of making a variation width of voltage level of bitline to be equal to or greater than a predetermined variation width of voltage level when a wordline is enabled.

To attain the advantages and in accordance with the purposes of the invention, as embodied and broadly described herein, one exemplary aspect of the invention may provide a semiconductor memory apparatus comprising: a switching unit configured to couple or decouple a cell plate voltage line to or from a cell plate electrode in response to a control signal; and a switching control unit configured to enable the control signal at a first timing and disable the control signal at a second timing.

In another aspect, a semiconductor memory apparatus may be configured to decouple a cell plate voltage line from a cell plate electrode during a time interval between a first timing when a wordline is enabled to a second timing when a sense amplifier is enabled.

In still another aspect of the present invention, a driving method of a semiconductor memory apparatus comprise: applying a cell plate voltage from a cell plate voltage line to a cell plate electrode; blocking applying the cell plate voltage from the cell plate voltage line to the cell plate electrode, from a timing when a wordline is enabled and charge sharing in a bitline is started to a timing when the charge sharing is completed; and applying the cell plate voltage from the cell plate voltage line to the cell plate electrode when a sense amplifier is enabled.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION OF THE EMBODIMENTS

Figure 1:
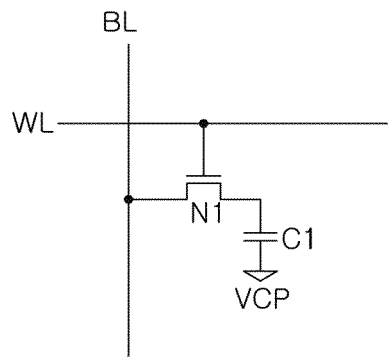
FIG. 1 is a diagram showing a configuration of a memory cell of a conventional semiconductor memory apparatus.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
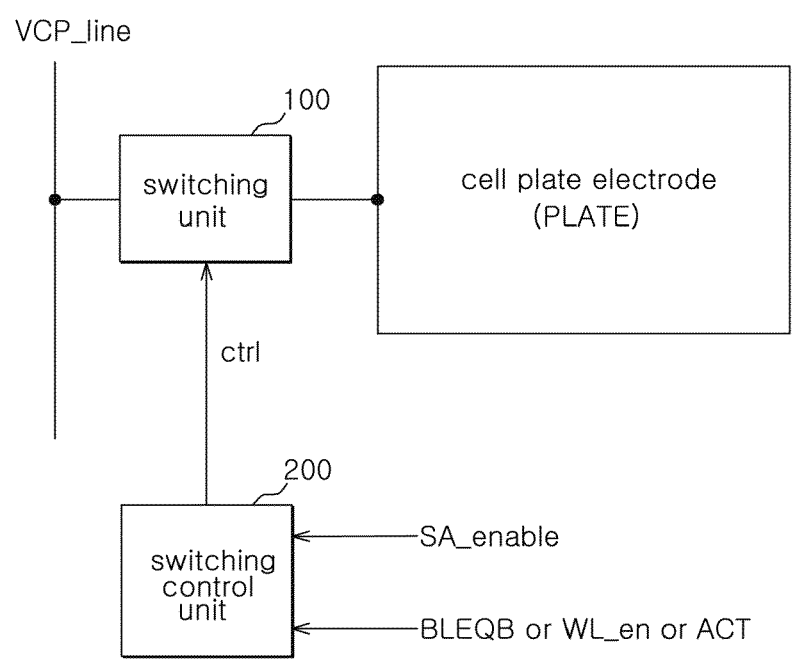
FIG. 2 is a block diagram schematically showing an exemplary configuration of a semiconductor memory apparatus according to one embodiment.

FIG. 2 is a block diagram schematically showing an exemplary configuration of a semiconductor memory apparatus according to one embodiment. As shown in FIG. 2, the semiconductor memory apparatus may include a cell plate voltage line VCP_line, a cell plate electrode PLATE, a switching unit 100, and a switching control unit 200.

Referring to FIG. 1, the cell plate voltage line VCP_line is a voltage line that provides the cell plate voltage VCP to the capacitor C1 constituting the memory cell.

Referring to FIG. 1, the cell plate electrode PLATE is a terminal where the capacitor C1 constituting the memory cell is applied with the cell plate voltage VCP from the cell plate voltage line VCP_line.

The switching unit 100 couples or decouples the cell plate voltage line VCP_line to or from the cell plate electrode PLATE in response to a control signal ctrl.

The switching control unit 200 enables the control signal ctrl at a first timing, and disables the control signal ctrl at a second timing. By way of example only, the first timing can be any timing between a timing when an active signal ACT is enabled and a timing when the wordline (shown in FIG. 1) is enabled. The second timing can be any timing when the sense amplifier (not shown) is enabled.

Figure 3:
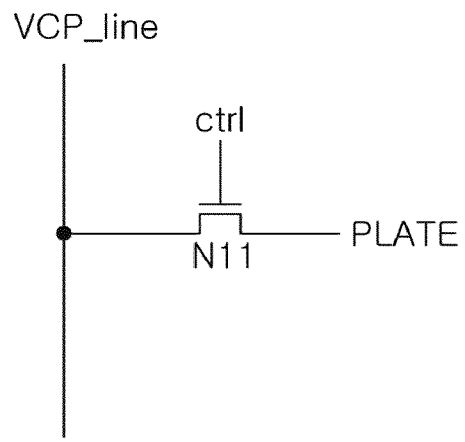
FIG. 3 is a diagram showing an exemplary configuration of a switching unit shown in FIG. 2.

FIG. 3 is a diagram showing an exemplary configuration of the switching unit 100 of FIG. 2. As shown in FIG. 3, the switching unit 100 may comprise a transistor N11. The transistor N11 has a gate configured to receive the control signal ctrl, and a source and a drain may be coupled to the cell plate voltage line VCP_line and the cell plate electrode PLATE, respectively. Although the switching unit 100 of this embodiment was described as an NMOS transistor, it should be understood that the NMOS transistor N11 can be substituted with any other switching element or switching circuit that can couple or decouple any two nodes.

Figure 4:
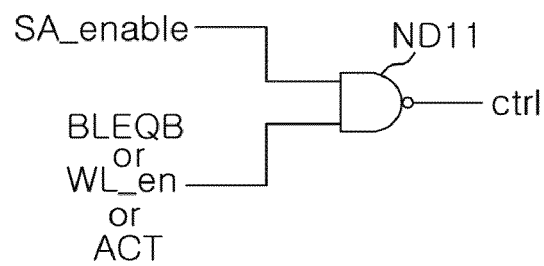
FIG. 4 is a diagram showing an exemplary configuration of a switching control unit shown in FIG. 2.

FIG. 4 is a diagram showing an exemplary configuration of the switching control unit 200 of FIG. 2. As shown in FIG. 4, the switching control unit 200 may comprise a NAND gate ND11. The switching control unit 200 can be configured to enable the control signal ctrl when the active signal ACT is enabled, and disable the control signal ctrl when a sense amplifier enable signal SA_enable is enabled. In this case, the NAND gate ND11 is configured to receive the sense amplifier enable signal SA_enable and the active signal ACT to output the control signal ctrl.

Alternatively or additionally, the switching control unit 200 can be configured to enable the control signal ctrl when a wordline enable signal WL_en is enabled, and disable the control signal ctrl when the sense amplifier enable signal SA_enable is enabled. In this case, the NAND gate ND11 is configured to receive the sense amplifier enable signal SA_enable and the wordline enable signal WL_en to output the control signal ctrl.

Alternatively or additionally, the switching control unit 200 can be configured to enable the control signal ctrl when a bitline precharge signal BLEQB is disabled, and disable the control signal ctrl when the sense amplifier enable signal SA_enable is enabled. In this case, the NAND gate ND11 is configured to receive the sense amplifier enable signal SA_enable and the bitline precharge signal BLEQB to output the control signal ctrl.

Figure 5:
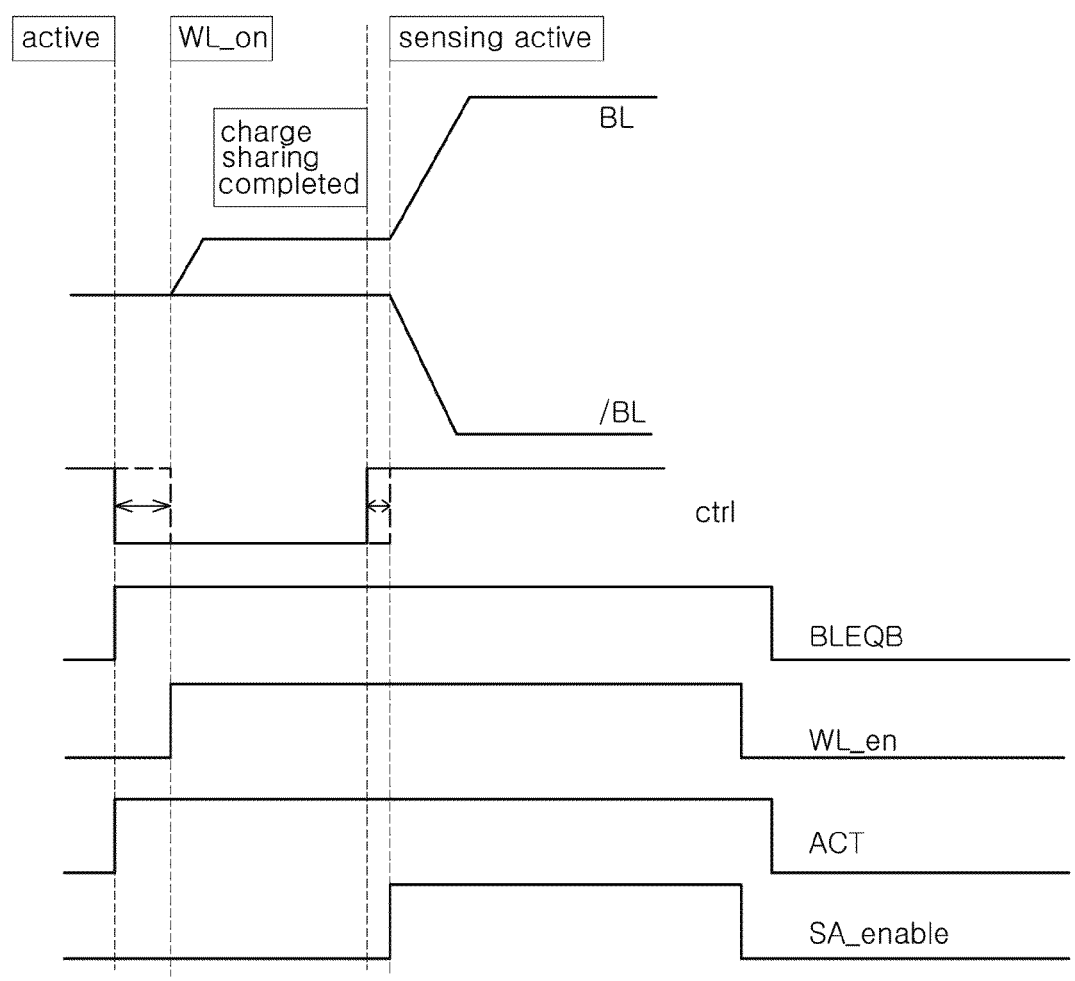
FIG. 5 is a timing diagram showing an exemplary operation of a semiconductor memory apparatus according to one embodiment.

With reference to FIG. 5, an exemplary operation of a semiconductor memory apparatus having a configuration similar to and consistent with the above-described configuration will be described.

FIG. 5 is a timing diagram showing an exemplary operation of the semiconductor memory apparatus. The switching control unit 200 receives the sense amplifier enable signal SA_enable and one of the active signal ACT, the wordline enable signal WL_en, and the bitline precharge signal BLEQB to generate the control signal ctrl. At this time, an enable timing of the control signal ctrl can be any timing between the enable timing of the active signal ACT and the enable timing of the wordline enable signal WL_en. In addition, a disable timing of the control signal ctrl can be any timing when the wordline is enabled and thereby charge sharing in the bitline is completed. Since the sense amplifier is generally enabled after the charge sharing is completed in the bitline the present embodiment was described with the sense amplifier enable signal SA_enable being the example. However, it should be understood that various other embodiments consistent with the present disclosure are not limited to the sense amplifier enable signal SA_enable.

The switching control unit 200 enables the control signal ctrl at a timing between the timing when the active signal ACT is enabled and the timing when the wordline enable signal WL_en is enabled, and disables the control signal ctrl at the timing when the charge sharing is completed in the bitline, e.g., when the sense amplifier enable signal SA_enable is enabled.

The switching unit 100 decouples the cell plate voltage line VCP_line from the cell plate electrode PLATE during a time interval where the control signal ctrl is enabled, and couples the cell plate voltage line VCP_line to the cell plate electrode PLATE during a time interval where the control signal ctrl is disabled.

As mentioned above, where the memory cell having the data value different from that of the adjacent memory cell transfers the data to the bitline (e.g., where the voltage level of the bitline is decreased, and the voltage level of the adjacent bitline is increased), the voltage level of the bitline cannot be decreased by as much as the predetermined voltage level width due to the coupling phenomenon. On the contrary, where the voltage level of the bitline is increased, and the voltage level of the adjacent bitline is decreased, the voltage level of the bitline cannot be increased by as much as the predetermined voltage level width due to the coupling phenomenon. Unless the voltage level variation width of the bitline is equal to or greater than the predetermined voltage level width, it may be difficult for the sense amplifier to perform the amplifying operation normally.

However, where the wordline is enabled and the memory cell transfers data to the bitline, the semiconductor memory apparatus consistent with the present disclosure decouples the cell plate voltage line VCP_line from the cell plate electrode PLATE to make the cell plate electrode PLATE floating.

Consequently, if a voltage level of the cell plate electrode PLATE coupled to the adjacent memory cell is increased, a voltage level of the cell plate electrode PLATE, which is coupled to the memory cell storing a data value different from that of the adjacent memory cell, is increased as well. If the voltage level of the cell plate electrode PLATE is increased, it may be the case where the voltage level of the bitline BL is applied to the capacitor C1. That is, there exists a data value of a logic low level in the capacitor C1.

If the memory cell that stores the data value different from that of the adjacent memory cell transfers the data to the bitline (e.g., assuming that the adjacent memory cell has the data value of the logic low level), the voltage level of the cell plate electrode PLATE coupled to the adjacent memory cell is increased. This, in turn, increases the voltage level of the bitline that is coupled to the memory cell storing a data value of a logic high level.

On the contrary, if the adjacent memory cell has the data value of the logic high level, the voltage level of the cell plate electrode PLATE coupled to the adjacent memory cell is decreased. This, in turn, decreases the voltage level of the bitline coupled to the memory cell that stores the data value of the logic low level.

Accordingly, the sense amplifier coupled to the memory cell that stores the data value different from that of the adjacent memory cell can operate normally.

The semiconductor memory apparatus consistent with the present disclosure enables the cell plate electrode to float from the timing when the wordline is enabled to the timing when the charge sharing is completed in the bitline. Therefore, where the memory cell storing the data value different from that of the adjacent memory cell transfers the data to the bitline, by using voltage level variation of the cell plate electrode, the semiconductor memory apparatus can substantially prevent the bitline coupled to the memory cell that stores the data value different from that of the adjacent memory cell from undergoing substantially the same voltage level variation caused by the coupling phenomenon associated with the adjacent bitline.

Throughout the description, including in the claims, the term "comprising a" should be understood as being synonymous with the term "comprising at least one" unless otherwise specified to the contrary.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor memory apparatus comprising:
    a switching unit configured to couple or decouple a cell plate voltage line to or from a cell plate electrode in response to a control signal; and
    a switching control unit configured to enable the control signal at a first timing and disable the control signal at a second timing,
    wherein the cell plate voltage line is a voltage line that provides a cell plate voltage to a capacitor constituting a memory cell, and
    the cell plate electrode is a terminal where the capacitor constituting the memory cell is applied with the cell plate voltage from the cell plate voltage line.

2. The semiconductor memory apparatus of claim 1, wherein the switching unit is configured to decouple the cell plate voltage line from the cell plate electrode when the control signal is enabled, and couple the cell plate voltage line to the cell plate electrode when the control signal is disabled.

3. The semiconductor memory apparatus of claim 2, wherein the first timing comprises a timing between when an active signal is enabled and when a wordline is enabled, and the second timing comprises a timing when a sense amplifier is enabled.

4. The semiconductor memory apparatus of claim 1, wherein the first timing comprises a timing when the active signal is enabled, and the second timing comprises a timing when a sense amplifier enable signal is enabled.

5. The semiconductor memory apparatus of claim 1, wherein the first timing comprises a timing when a bitline precharge signal is disabled, and the second timing comprises a timing when a sense amplifier enable signal is enabled.

6. The semiconductor memory apparatus of claim 1, wherein the first timing comprises a timing when a wordline enable signal is enabled, and the second timing comprises a timing when a sense amplifier enable signal is enabled.

7. A driving method of a semiconductor memory apparatus, comprising:
    applying a cell plate voltage from a cell plate voltage line to a cell plate electrode;
        blocking applying the cell plate voltage from the cell plate voltage line to the cell plate electrode, from a timing when a wordline is enabled and charge sharing in a bitline is started to a timing when the charge sharing is completed; and
    applying the cell plate voltage from the cell plate voltage line to the cell plate electrode when a sense amplifier is enabled,
        wherein the cell plate voltage line is a voltage line that provides a cell plate voltage to a capacitor constituting a memory cell, and
        the cell plate electrode is a terminal where the capacitor constituting the memory cell is applied with the cell plate voltage from the cell plate voltage line.

8. The driving method of claim 7, wherein blocking applying the cell plate voltage comprises blocking applying the cell plate voltage from a timing when an active signal is enabled to a timing when the sense amplifier enable signal is enabled.

9. The driving method of claim 7, wherein blocking applying the cell plate voltage comprises blocking applying the cell plate voltage from a timing when a bitline precharge signal is disabled to a timing when the sense amplifier enable signal is enabled.

10. The driving method of claim 7, wherein blocking applying the cell plate voltage comprises blocking applying the cell plate voltage from a timing when a wordline enable signal is enabled to a timing when the sense amplifier enable signal is enabled.

* * * * *